United States Patent [19]

Voorman

[11] Patent Number: 5,416,647
[45] Date of Patent: May 16, 1995

[54] CONTINUOUS-TIME ANALOG SIGNAL FILTER ARRANGEMENT, FOR USE AS AN EQUALIZER

[75] Inventor: Johannes O. Voorman, Eindhoven, Netherlands

[73] Assignee: U.S. Philips Corporation, New York, N.Y.

[21] Appl. No.: 139,495

[22] Filed: Oct. 19, 1993

[30] Foreign Application Priority Data

Oct. 26, 1992 [EP] European Pat. Off. ........... 92203273

[51] Int. Cl.[6] .......................... G11B 5/035; G11B 5/02
[52] U.S. Cl. .......................................... 360/65; 360/67
[58] Field of Search .................. 307/520, 521; 333/18, 333/166, 28; 360/65, 46, 67

[56] References Cited

PUBLICATIONS

P. Pai et al., "A simple continuous-time equalizer for use in magnetic storage read channels", IEEE Journal on Selected Areas in Communications, vol. 10, No. 1, Jan. 1992, pp. 289-299.
R. C. Schneider, "An improved pulse-slimming method for magnetic recording", IEEE Transactions on Magnetics, vol. Mag-11, No. 5, Sep. 1975, pp. 1240-1241.
G. A. de Veirman et al., "Monolithic 10-30 MHz tunable bipolar Bessel lowpass filter", Proc. of the ISCAS, pp. 1444-1447, 1991 no month available.
Trihy et al., "An Accurate and Compact Model For The Transient Simulation of Continuous-Time Filters", Proc. of the IEEE 1990 Custom Integrated Circuits, pp. 881-884. May 1990.
Gensel, "Entwurf Von RC-Activen FLF-Filtern", Nachrichten Technik Elektronik, vol. 27, No. 5, 1977, pp. 200-202 no month available.

Primary Examiner—Aristotelis Psitos
Assistant Examiner—Patrick Wamsley
Attorney, Agent, or Firm—Edward W. Goodman

[57] ABSTRACT

A continuous-time analog signal filter arrangement, for realizing a magnitude frequency characteristic which increases for increasing frequencies over a part of the operating frequency range of the filter arrangement, includes an input terminal (1) for receiving an input signal, an output terminal (9) for supplying an output signal which is a filtered version of the input signal, and a number of N integrator elements (5.1, 5.2, . . . , 5.N) connected in series and being included in a feedback loop, where $N \geq 2$. For each of the N integrator elements the relation holds that the input signal of an integrator element is a differentiated version of its output. Further, the filter arrangement includes a first multiplier arrangement (7) for multiplying the signals present at the input of the first integrator element in the series arrangement of N integrator elements and present at the outputs of the integrator elements by a multiplication factor (a(n)) and for supplying the multiplied signals to signal combination circuit (6), an output (8) of which is being coupled to the output terminal.

17 Claims, 7 Drawing Sheets

CONTINUOUS-TIME ANALOG SIGNAL FILTER ARRANGEMENT, FOR USE AS AN EQUALIZER

1. FIELD OF THE INVENTION

The invention relates to a continuous-time analog signal filter arrangement, for realizing a magnitude frequency characteristic which increases for increasing frequencies over a part of the operating frequency range of the filter arrangement, comprising an input terminal for receiving an input signal, an output terminal for supplying an output signal which is a filtered version of the input signal, and a number of N integrator elements connected in series and being included in a feedback loop, where N is an integer number for which hold that $N \geq 2$.

b 2. Description of the Related Art

Such an arrangement is known from the publication "A simple continuous-time equalizer for use in magnetic storage read channels", by P. Pai et al., IEEE journal on selected areas in communications, Vol. 10, no. 1, January 1992. The arrangement enables the realization of a fixed filter characteristic, as regards magnitude and phase, as a function of frequency, that is an accurate approximation of a required filter characteristic, so as to equalize a RLL coded signal obtained from a magnetic recording channel, as well as to limit the noise included in said signal.

The known filter arrangement, however, has the disadvantage that it is not well possible to realize a filter characteristic which is variable as regards magnitude and phase.

Variable equalizers for a magnetic recording channel are known in the art, see e.g. the publication "An improved pulse-slimming method for magnetic recording", by R. C. Schneider in IEEE Trans. on magnetics, Vol. MAG-11, no. 5, September 1975, pp. 1240/1. Cascading the filters of Pai et al and Schneider so as to obtain, in addition to the Pai et al filter, a variability of the filter characteristic, leads to an increase in complexity.

SUMMARY OF THE INVENTION

The invention has for its object to provide a filter arrangement which enables the realization of a variable filter characteristic with acceptable complexity, so that it can be used, for example, in a reproducing arrangement for reproducing an information signal from a track in a magnetic record carrier for equalizing a RLL coded information signal, or other information signals such as PR IV (partial response class IV) coded information signals.

The filter arrangement is characterized in that for each two successive integrator elements in the series arrangement of the N integrator elements, the relation holds that the output signal of the first one of said two successive integrator elements is a differentiated version of the output signal of the next one of said two successive integrator elements, that the filter arrangement includes first multiplier means for multiplying the signals present at the input of the first integrator element in the series arrangement of N integrator elements and present at the outputs of the integrator elements, by a multiplication factor, and for supplying the multiplied signals to a first signal combination means, an output of the first signal combination means being coupled to the output terminal, that at least a number of the multiplication factors in the first multiplier means is variable, that the filter arrangement includes second multiplier means for multiplying the signals present at the input of the first integrator element in the series arrangement of N integrator elements and present at the outputs of the integrator elements by a second multiplication factor and for supplying the multiplied signals to a second signal combination means, an output of the second signal combination means being coupled to an input of the series arrangement via an additional integrator element.

The invention is based on the following recognition. Reading out an information signal that is transmitted via a transmission channel, such as a magnetic recording-/reproduction channel requires a shaping filter in the receiver that is adapted to the kind of transmission channel as well as to the signal format of the information signal. This shaping filter is a fixed filter, has a low-pass filter characteristic and can be realized by the filter arrangement of the invention. Specific in the filter arrangement in accordance with the invention is the special construction of the true integrator elements in the first series arrangement of the filter arrangement. By using a series arrangement of true integrator elements, in the sense that their input signals are differentiated versions of their output signals, it has become possible to extract an output signal and one, two, three times, etc., differentiated versions of that output signal from the series arrangement. The output signal mentioned is the output signal of the shaping filter as being a fixed filter. The other output signals, being the once, twice, ... etc., differentiated versions of said output signal, have become available without any additional circuit complexity compared to the realization of the filter as a fixed filter. By multiplying the output signals by certain coefficient values that can be variable, one can variably combine those output signals so as to obtain various output signals with the arrangement. By means of the arrangement various filter characteristics as regards magnitude and phase become realizable, such that an accurate representation of a required filter characteristic having a increasing magnitude characteristic as a function of frequency can be obtained.

As a result a variable equalizer can be obtained for equalizing a RLL signal transmitted via a magnetic recording channel which has a complexity which at most equals the complexity of the fixed filter of the Pai et al document. Further, the variable equalizer enables the equalization of a signal transmitted via a PR IV magnetic recording channel, or other kinds of recording channels.

With the filter arrangement, a fixed filter can be realized having a frequency characteristic between the input terminal and the output of the last integrator element in the first series arrangement which is of the form:

$$\frac{n(0)}{d(0) + d(1) \cdot p + \ldots + d(N+1) \cdot p^{N+1}} \quad \text{EQ(1)}$$

where $p = j\omega$.

The filter arrangement may be further characterized in that the arrangement comprises a second series arrangement of $K+1$ integrator elements, the additional integrator element being the first integrator element in the second series arrangement of $K+1$ integrator elements, an output of the last integrator element in the second series arrangement being coupled to the input of the first integrator element in the first series arrangement, where K is an integer for which it holds that K is equal to or larger than 0, and that for the last integrator element in the second series arrangement and the first integrator element in the first series arrangement, the relation holds that the output signal of the last integrator element in the second series arrangement is a differentiated version of the output signal of the first integrator element in the first series arrangement. The second series arrangement is provided so as to realize a transmission characteristic between the input terminal and the output of the last integrator element in the first series arrangement which is in the form of $$H(p) = \frac{n(0) + n(1)\cdot p + \ldots + n(K)\cdot p^K}{d(0) + d(1)\cdot p + \ldots + d(K+N+1)\cdot p^{K+N+1}} \quad \text{EQ(2)}$$

More specifically, the circuit part including the second series arrangement relates to the numerator and a part of the denominator in the above formula.

It is to be noted that the publication titled "Monolithic 10–30 MHz tunable bipolar Bessel lowpass filter", by G. A. de Veirman et at. in Proc. of the ISCAS, pp. 1444–7, 1991, discloses a filter arrangement having integrator elements and two outputs that are coupled to corresponding inputs of a signal combination unit via variable multiplier means, so as to obtain a combined output signal. The known filter arrangement is of a different filter construction than the filter arrangement as claimed and has less freedom to approximate a required filter characteristic as regards magnitude and phase as a function of frequency.

BRIEF DESCRIPTION OF THE DRAWING

These and further aspects of the invention will be described in further detail with reference to a number of embodiments in the following figure description, in which.

DESCRIPTION OF PREFERRED EMBODIMENTS

Figure 1:
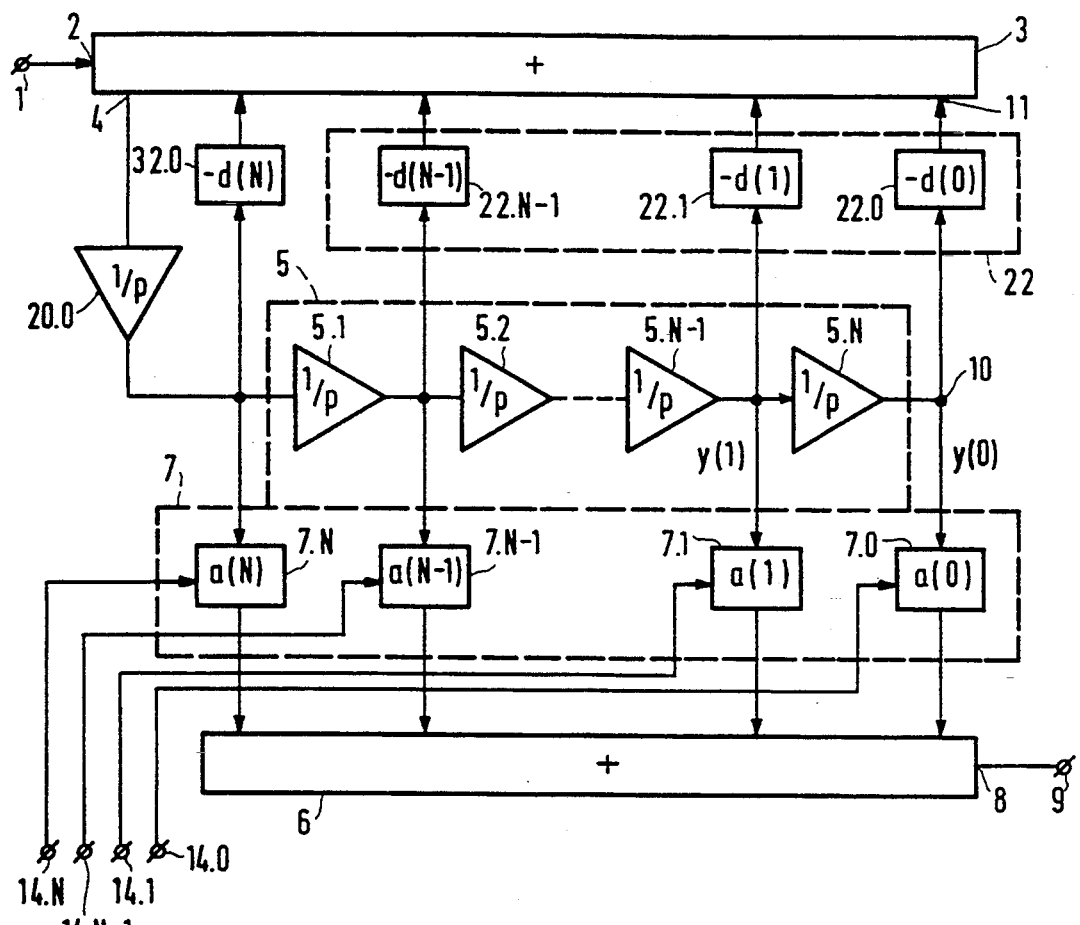
FIG. 1 shows a first embodiment of the filter arrangement.

FIG. 1 shows a first embodiment of the filter arrangement, comprising an input terminal 1 which is coupled to a first input 2 of a signal combination unit 3. An output 4 of the signal combination unit 3 is coupled to an input of a series arrangement 5 of N integrator elements 5.1 to 5.N via an additional integrator element 20.0. The input of the first integrator element 5.1 and the outputs of the N integrator elements are coupled to a signal combination unit 6 via multiplication means 7. The multiplication means 7 comprise multipliers 7.0 to 7.N. The multiplier 7.N multiplies the input signal of the integrator element 5.1 by a factor a(N). The multiplier 7.N−1 multiplies the output signal of the integrator element 5.1 by a factor a(N−1). The multiplicator 7.1 multiplies the output signal of the integrator element 5.N−1 by a factor of a (1), and the multiplicator 7.0 multiplies the output signal of the integrator element 5.N by a factor a(0). The output 8 of the signal combination means 6, which can be in the form of an adder, is coupled to the output terminal 9 of the filter arrangement. The output 10 of the series arrangement 5 is coupled to an input 11 of the combination unit 3, so as to realize a negative feedback loop including the series arrangement 5.

More specifically, outputs of the N integrator elements 5.1 to 5.N of the series arrangement 4 are coupled via multiplication means 22 to corresponding inputs of the signal combination unit 3. The multipliers means 22 comprise multiplicators 22.0 to 22.N−1. The multiplier 22.N−1 multiplies the output signal of the integrator element 5.1 by a factor −d(N−1). The multiplier 22.1 multiplies the output signal of the integrator element 5.N−1 by a factor of −d(1) and the multiplier 22.0 multiplies the output signal of the integrator element 5.N by a factor −d(0). In addition, the input of the first integrator element 5.1 is coupled to an input of the signal combination means 3 via a multiplier 32.0, which multiplies the signal applied to its input by a factor −d(N). The signal combination means 3 can be in the form of an adder.

At least a number of the multiplication factors a(n) in the multiplication means 7 are variable. This can be realized by manually varying the multiplication factors, or by varying the multiplication factors under the influence of control signals applied via inputs 14.0 to 14.N.

Figure 2A:
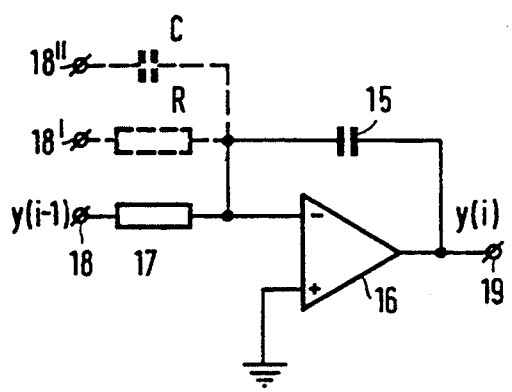
FIG. 2 shows two possible versions of an integrator element for which holds that its input signal is a differentiated version of its output signal.

Essential in the filter arrangement is that the output signals of the integrator elements 5.1 to 5.N are differentiated versions of each other. That is: $y(1)=dy(0)/dt$, $y(2)=dy(1)/dt$ etc. This means that the integrator elements can be of the construction as shown in FIG. 2a. The integrator element of FIG. 2a includes an operational amplifier 16, a resistor 17 coupled between the input 18 and the inverting input of the amplifier 16 and a capacitor 15 coupled between the inverting input and the output 19 of the amplifier 16. In order to realize the relation $y(i-1)=dy(i)/dt$ between the input signal $y(i-1)$ and the output signal $y(i)$ of the amplifier 16, the amplifier should comprise only one input terminal, and there should be no other input terminals, such as 18' and 18", via which an additional input signal can be applied to the inverting input via an additional resistor R or a capacitor C, respectively.

Figure 2B:
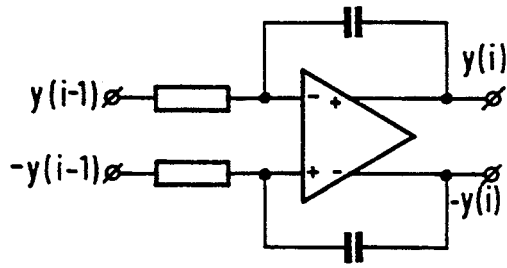

An other embodiment of the integrator elements 5.1 to 5.N is shown in FIG. 2b. The integrator element is in the form of a balanced integrator.

Figure 3:
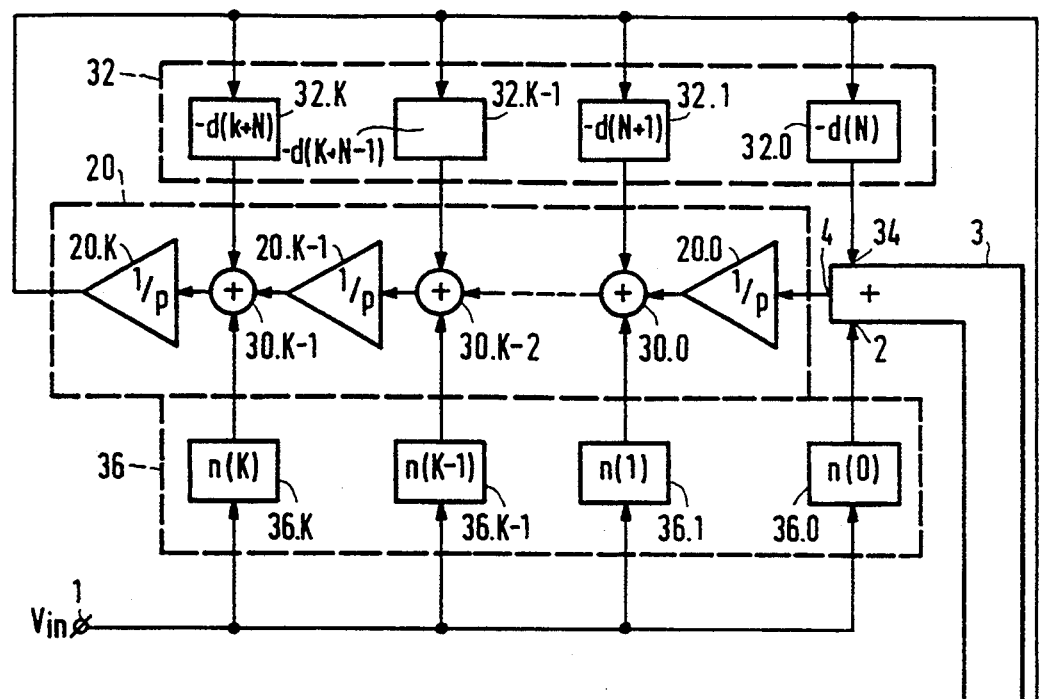
FIG. 3 a second embodiment.
Figure 3:
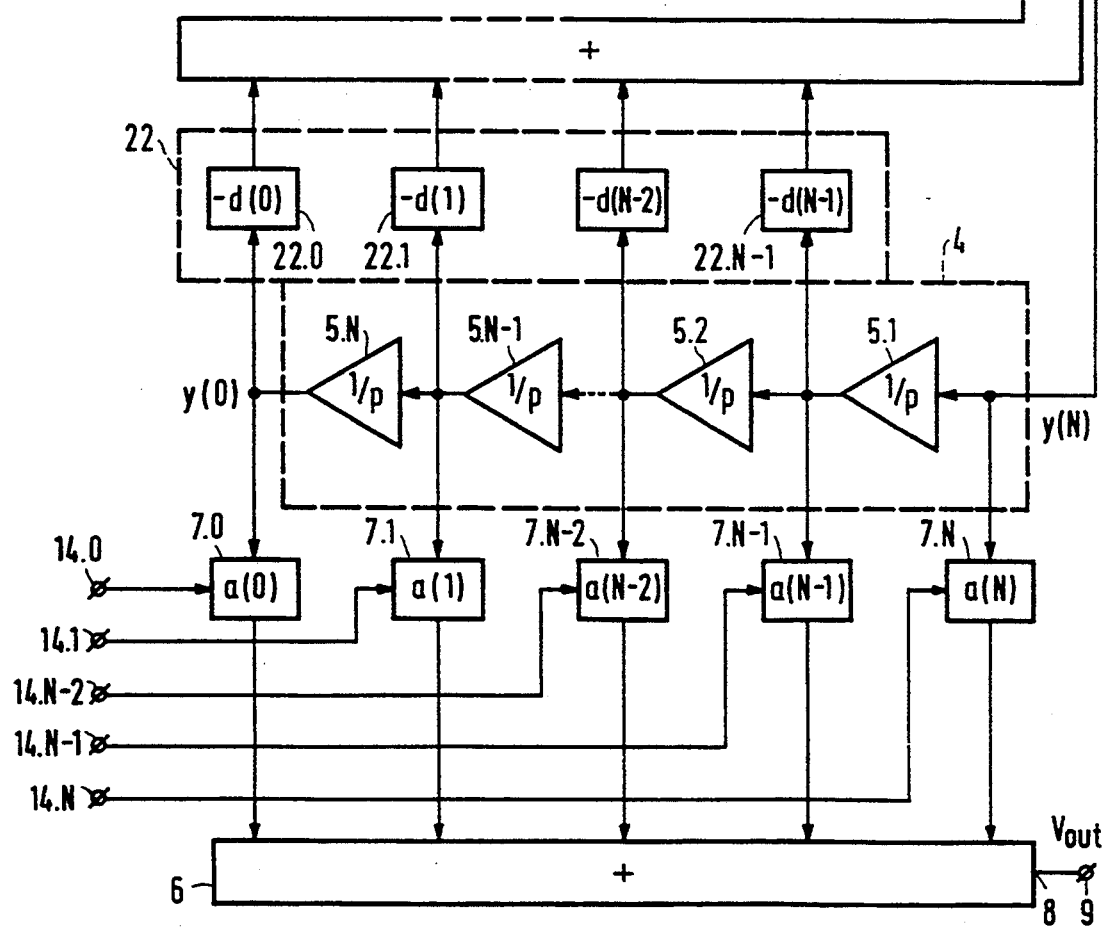

FIG. 3 shows a second embodiment which is a further elaboration of the arrangement of FIG. 1. The embodiment of FIG. 2 includes a second series arrangement 20 of K+1 integrator elements 20.0 to 20.K. The additional integrator element 20.0 of FIG. 1 is the first integrator element in the second series arrangement 20. The output 4 of the signal combination unit 3 is coupled to the input of the first integrator element 20.0 of the series arrangement 20. The output of the last integrator element 20.K is coupled to the input of the first integrator element 5.1 of the series arrangement 4.

In the most general construction of the arrangement, signal combination units 30.0, 30.1, . . . , 30.i, . . . , 30.K−2 and 30.K−1, which can be in the form of adders, are included between the output of an integrator element 20.i and the input of a subsequent integrator element 20.i+1 in the series arrangement 20. Further, the output of the last integrator element 20.K in the series arrangement 20 is coupled via multiplication means 32 to inputs of the signal combination units 30.0 to 30.K−1. The multiplication means 32 comprise the multiplier 32.0 of FIG. 1 as well as the multiplier 30.1 to 32.K. The multiplier 32.1 multiplies the output signal of the integrator element 20.K by a factor of $=d(N+1)$, the multiplier 32.K−1 multiplies the output signal of the integrator element 20.K by a factor of $-d(K+N-1)$ and the multiplier 32.K multiplies the output signal of the integrator element 20.K by a factor $-d(K+N)$. The output of the multiplier 32.1 is coupled to an input of the signal combination unit 30.0. The output of the multiplier 32.K−1 is coupled to an input of the signal combination unit 30.K−2. The output of the multiplier 32.K is coupled to an input of the signal combination unit 30.K−1. Further, the input terminal 1 can be coupled to the signal combination units 3 and 30.0 to 30.K−1 via multiplication means 36. The multiplication means 36 comprise multiplier 36.0 to 36.K. The multiplier 36.0 multiplies the input signal applied to the input terminal 1 by a factor n(0). The multiplier 36.1 multiplies the input signal by a factor of n(1), the multiplier 36.K−1 multiplies the input signal by a factor of n(K−1) and the multiplier 36.K multiplies the input signal by a factor n(K). The output of the multiplier 36.0 is coupled to the input 2 of the signal combination unit 3'. The output of the multiplicator 36.1 is coupled to an input of the signal combination unit 30.0. The output of the multiplier 36.K−1 is coupled to an input of the signal combination unit 30.K−2. The output of the multiplier 36.K is coupled to an input of the signal combination unit 30.K−1.

The functioning of the arrangement of FIG. 3 will be explained hereafter.

The transfer function of the arrangement between the signal $V_{in}$ applied to the input terminal 1 and the signal y(N) present at the input of the integrator element 5.1 can be written as follows:

$$y(N) = \qquad \text{EQ(3)}$$

$$\frac{1}{p}\left( n(K) \cdot V_{in} - d(K+N) \cdot y(N) + \frac{1}{p}(n(K-1) \cdot V_{in} + \right.$$

-continued $$\left. - d(K+N-1) \cdot y(N) + \frac{1}{p}\left( \ldots + \frac{1}{p}(n(0) \cdot V_{in} - d(N) \cdot \right.\right.$$

$$y(N) + \frac{1}{p}\left( - d(N-1) \cdot y(N) + \frac{1}{p}(-d(N-2) \cdot\right.$$

$$y(N) + \frac{1}{p}( \ldots +$$

$$\left.\left.\left.\frac{1}{p}\left( - d(1) \cdot y(N) + \frac{1}{p}(- d(0) \cdot y(N)) \ldots \right)\right) \ldots \right)\right)$$

Rearranging this formula leads to the moving formula $$\frac{y(N)}{V_{in}} = \frac{n(0) \cdot p^N + n(1) \cdot p^{N+1} + \ldots + n(K) \cdot p^{K+N}}{d(0) + d(1) \cdot p + \ldots + d(K+N+1) \cdot p^{K+N+1}} \quad \text{EQ(4)}$$

The transfer functions from the input to the output of one of the integrator elements in the series arrangement 4 can now be obtained very easily, by dividing the numerator of EQ (4) by p for each subsequent integrator element. In this way, the transfer function H(p) which equals $y(0)/V_{in}$, has the following expression:

$$H(p) = \qquad \text{EQ(5)}$$

$$\frac{y(0)}{V_{in}} = \frac{n(0) + n(1) \cdot p + \ldots + n(K) \cdot p^K}{d(0) + d(1) \cdot p + \ldots + d(K+N+1) \cdot p^{K+N+1}}$$

This expression equals the expression of EQ (2) given above.

The (K+N+1)-th order transfer function, of which the coefficients can be chosen at will, enables all kinds of transmission characteristics to be realized. Moreover, the output signal $V_{out}$ present at the output terminal 9 is a combination of the signals y(0) to y(N), so that all kind of filter characteristics can be realized as regards magnitude and phase as a function of frequency, between the input terminal 1 and the output terminal 9. More specifically, the even-numbered multiplier coefficients a(0), a(2), . . . etc. are used to control the real part of the transfer function $V_{out}/V_{in}$, and the odd numbered multiplier coefficients a(1), a(3), . . . etc. are used to control the imaginary component of the said transfer function. This can be explained as follows.

The equation for $V_{out}/V_{in}$ can be written as follows:

$$\frac{V_{out}}{V_{in}} = a(0) \cdot H(p) + a(1) \cdot j\omega \cdot H(p) + a(2) \cdot (-\omega^2) \cdot H(p) +$$

$$+ a(3)(-j\omega^3) \cdot H(p) + \ldots$$

Combining the various real components together and combining the imaginary components together leads to the following formula:

$$\frac{V_{out}}{V_{in}} = a(0) \cdot H(p) + a(2) \cdot (-\omega^2) \cdot H(p) + \ldots +$$

$$a(1) \cdot j\omega \cdot H(p) + a(3)(-j\omega^3) \cdot H(p) + \ldots$$

The even-numbered terms in the formula realize the real part of the transfer function $V_{out}/V_{in}$ and the odd-numbered terms realize the imaginary component of the transfer function.

If the transfer function H(p) is chosen such that it realizes a certain nominal phase which is fixed, and whose value is such that the variations of the coefficients a(n) are only needed to realize variations of the phase around 0°, it becomes clear from the above equation for $V_{out}/V_{in}$ that the variations in the values of the odd numbered multiplier coefficients results mainly in variations of the phase only, while the variations in the even numbered multiplier coefficients results mainly in variations of the magnitude only.

In the application of the filter arrangement as an equalizer filter for use in a magnetic reproduction arrangement, the filter arrangement should exhibit a magnitude response which increases as a function of frequency in a certain part of the operating frequency range of the filter arrangement, in order to equalize the recording channel characteristic.

Figure 4A:
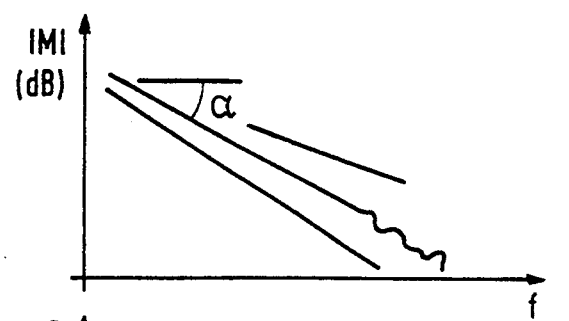
FIG. 4 shows the magnitude and phase of the recording channel as a function of frequency.
Figure 4B:
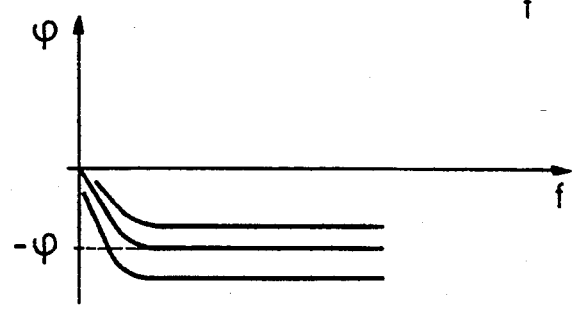

FIG. 4a shows the magnitude of the transmission characteristic of the transmission path including the recording channel up to the output of a reproduction head of the magnetic reproduction arrangement, expressed in dB as a function of the frequency which is plotted on a linear scale. The magnitude is a more or less straight line which descends for increasing frequencies. The declination angle of the line is indicated by $\alpha$, where $\alpha$ can vary dependent of the high frequency losses of the transmission path. Two other possible curves with other inclination angles are shown in FIG. 4a as well, indicating recording channels with other values for the high frequency losses. FIG. 4b shows the phase response of the transmission path as a function of frequency. The phase response has a linear phase component and a constant component as a function of frequency. As the linear component only results in a fixed delay, there is no need in further including this linear phase component in the further discussion. The constant phase component has been shown in FIG. 4b and equals $-\phi$. Two other possible curves for the phase are shown in FIG. 4b as well, indicating recording channels with other values for the phase.

Figure 5A:
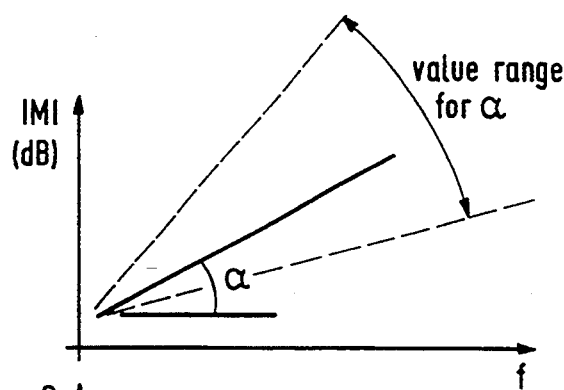
FIG. 5 shows the magnitude and phase of the equalizer that has to equalize the characteristic of the recording channel.
Figure 5B:
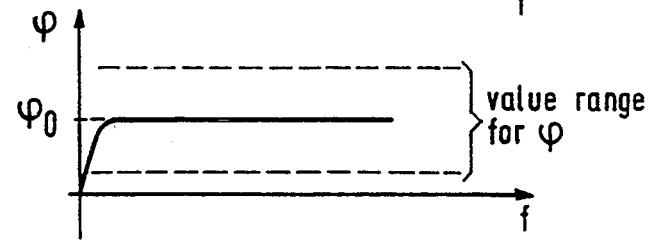

Equalizing this magnitude and phase responses means that the filter arrangement of FIG. 1 or 3 should exhibit responses as given in FIG. 5.

In order to simplify the variability of the variable equalizer, one can include a pre-equalizer into the variable equalizer, which pre-equalizer has a fixed frequency characteristic. This fixed frequency characteristic is such that its magnitude is in the form of a curve having a slope $\alpha_0$ which lies inside the possible value range for $\alpha$, see FIG. 5a, so that the variable equalizer part only needs to realize curves having slopes around $\alpha = 0$. Further, the phase of the fixed frequency characteristic of the pre-equalizer is such that, as stated previously, it has a value $\phi_0$ which lies in the possible range of phase values, see FIG. 5b, so that the variable equalizer part only needs to realize phases $\phi$ around a phase value $\phi = 0°$.

Figure 6A:
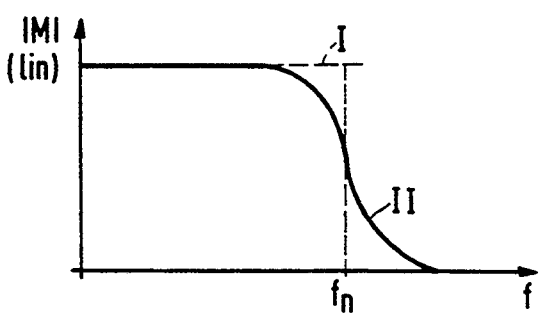
FIG. 6 shows examples of a noise shaping filter and a cosine filter used reading out a magnetic reproduction channel.
Figure 6B:
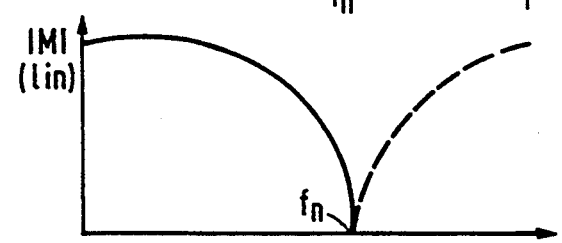

As has been said previously, reproduction of an information signal received from a transmission channel, such as a magnetic recording channel requires a shaping filter with a certain fixed frequency characteristic. A shaping filter, when realizing PR4 detection has the form of a series arrangement of a noise limiting filter having a low-pass characteristic, such as shown in FIG. 6a, and a cosine filter such as shown in FIG. 6b. The phase as a function of frequency of both filters can be considered to be linear, and therefore deserves no further discussion, see above.

As a result, the filter arrangement should exhibit a fixed filter characteristic $y(0)/V_{in}$ which equals the transmission characteristic of the above series arrangement of the noise limiting filter and the cosine filter, and also the pre-equalization filter discussed previously (if present). This filter characteristic as regards magnitude is shown by either the curve $Y_1$ (in this case, no pre-equalizer is present) or by the curve $Y_2$ in FIG. 8.

In the presence of the pre-equalizer, the phase equals the value discussed above.

Figure 7A:
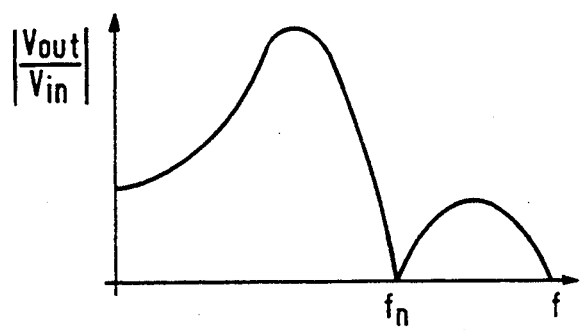
FIG. 7 shows an example of the filter characteristic realized by the equalizer filter arrangement.
Figure 7B:
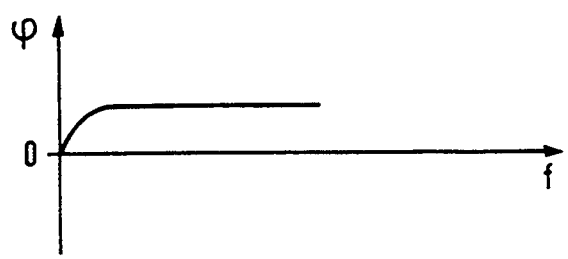

As a result, the filter arrangement of FIG. 1 or 3 must realize filter characteristics $V_{out}/V_{in}$ as given in FIG. 7.

Figure 8:
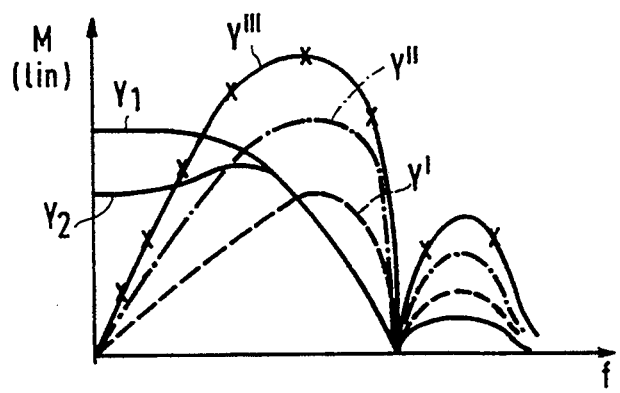
FIG. 8 shows a number of characteristics from which the characteristic of FIG. 7 can be obtained.

The characteristics of FIG. 8 show how the filter characteristic as shown in FIG. 7 can be realized. As has been said previously, the curve $Y_1$ or $Y_2$ in FIG. 8 shows the (fixed) magnitude characteristic of the transmission path from the input terminal 1 to the output of the integrator element 5.N. Further, Y' now is the magnitude characteristic of the transmission path from the input terminal 1 to the output of integrator element 5.N−1. Y' is the one time differentiated version of $Y_1$ or $Y_2$.

Y'' now is the magnitude characteristic of the transmission path from the input terminal 1 to the output of integrator element 5.N−2. Y'' is the twice differentiated version of $Y_1$ or $Y_2$. This goes on for the other output(signal)s of the integrator elements in the series arrangement 5.

Under the influence of control signals applied to the various multipliers 7.0 to 7.N it is clear that the curves Y (that is $Y_1$ or $Y_2$), Y', Y'', ... etc. can be combined in such a way that the magnitude curve of FIG. 7a can be realized.

In another embodiment, the transmission characteristic as given in FIG. 7 can be realized by making a transmission characteristic H'(p) which equals: $y(0)/V_{in} = H_1(p).H_2(p).H_3(p)$, where $$H_1(p) = \frac{q(0) + q(2) \cdot p^2}{b(0) + b(1) \cdot p + b(2) \cdot p^2 + b(3) \cdot p^3},$$

$$H_2(p) = c(0) - c(1) \cdot p,$$

and $$H_3(p) = \frac{1}{d(0) + d(1) \cdot p + d(2) \cdot p^2 + d(3) \cdot p^3 + p^4}.$$

Figure 9:
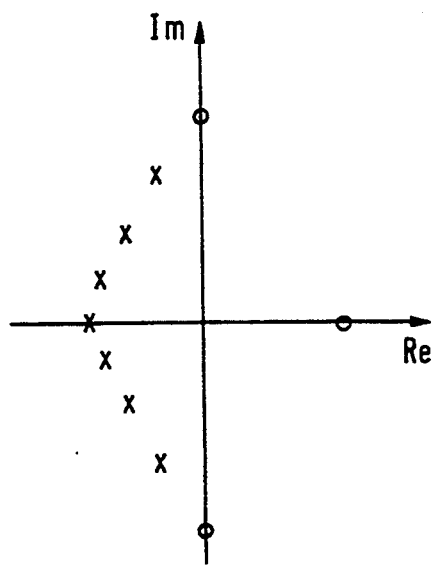
FIG. 9 shows a pole-zero plane in which the poles and zeroes of a 7th-order equalizer filter are shown.

The zero-pole pattern of this 7th-order filter characteristic is given in FIG. 9. The numerator of $H_1(p)$ realize the zero pair indicated by an "o" and located on the $j\omega$-axis of the pole-zero plane of FIG. 9. This zero-pair realizes the zero point in the transmission characteristic at the Nyquist frequency $f_n$. $H_2(p)$ realize the real-axis zero, in the same way indicated by an "o". The 7th-order denominator of H'(p) realize the seven poles, indicated by an "x". The real-axis pole and one of the complex polepairs is realized by the denominator of $H_1(p)$, and the two other complex pole-pairs are realized by the denominator of $H_3(P)$.

Figure 10:
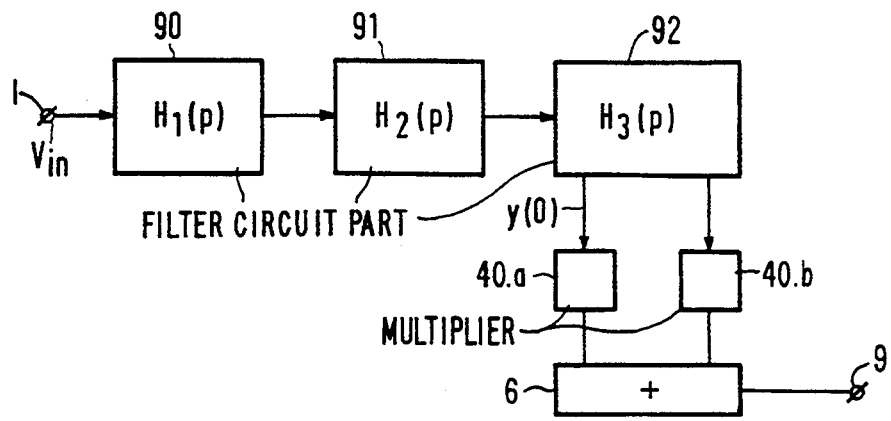
FIG. 10 shows the filter being divided into three circuit parts.

This filter can be realized by means of three circuit parts, see FIG. 10. A first filter circuit part 90 which realizes $H_1(p)$, a second filter circuit part 91 which realizes $H_2(P)$, and a third filter circuit part 92 which realizes $H_3(p)$, the outputs from $H_3(p)$ being connected to the signal combination means 6 via multipliers 40.a and 40.b.

Figure 11A:
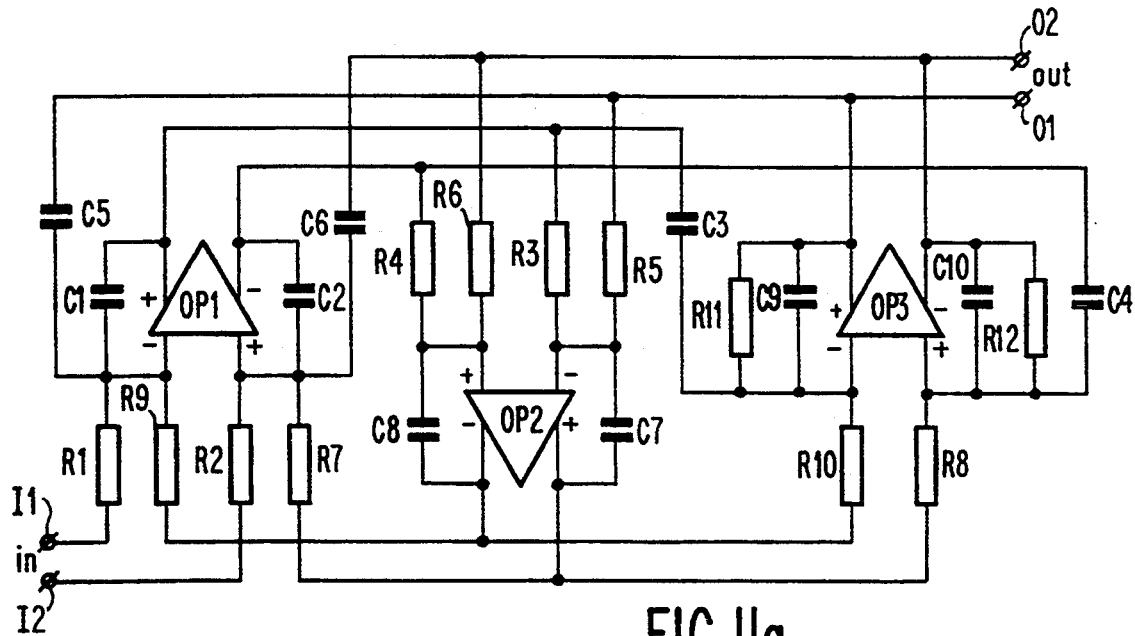
FIG. 11a shows the construction of a first circuit part of the filter of FIG. 10.

FIG. 11a shows a circuit construction to realize H₁(p), in which use has been made of balanced integrators as shown in FIG. 2b. In particular, filter circuit part H₁(p) includes operational amplifiers OP1, OP2 and OP3. The inverting input of OP1 receives the input signal from input terminal I1 through resistor R1 while the non-inverting input receives the input signal from input terminal I2 through resistor R2. Capacitor C1 couples the inverting input to the non-inverting output of OP1 while capacitor C2 couples the non-inverting input to the inverting output of OP1. The non-inverting output of OP1 is connected to inverting input of OP2 via resistor R3 and to the inverting input of OP3 via capacitor C3. The inverting output of OP1 is connected to the non-inverting input of OP2 via resistor R4 and to the non inverting input of OP3 via capacitor C4. The inverting input of OP1 is further connected, via capacitor C5, to the first output O1 of the filter circuit part and to inverting input of OP2 via resistor R5. The non inverting input of OP1 is connected, via capacitor C6, to the second output O2 and to non-inverting input of OP2 via a resistor R6. The inverting input of OP2 is connected to the non-inverting output of OP2 via capacitor C7 while the non-inverting input is connected to the inverting output of OP2 via capacitor C8. The non-inverting output of OP2 is connected to the non-inverting input of OP1 via resistor R7 and to the non-inverting input of OP3 via resistor R8, while the inverting output of OP2 is connected to the inverting input of OP1 via resistor R9 and to the inverting input of OP3 via resistor R10. Finally, the inverting input of OP3 is connected to its non-inverting output via the parallel combination of resistor R11 and capacitor C9, while the non-inverting input is connected to the inverting output via the parallel combination of resistor R12 and capacitor C10. The non-inverting output of OP3 is connected to the first output O1 and the inverting output of OP3 is connected to the second output O2.

Figure 11B:
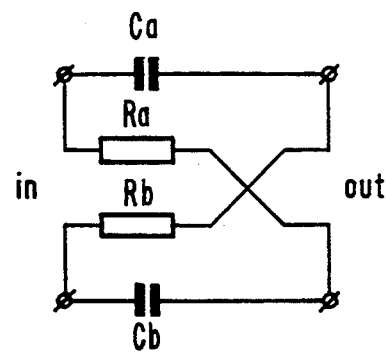
FIG. 11b shows the construction of a second circuit part of the filter of FIG. 10.

H₂(p) can be realized by a resistor (Ra, Rb) and a cross-coupled capacitor-pair (ca, cb), a circuit construction of which is given in FIG. 11b.

Figure 11C:
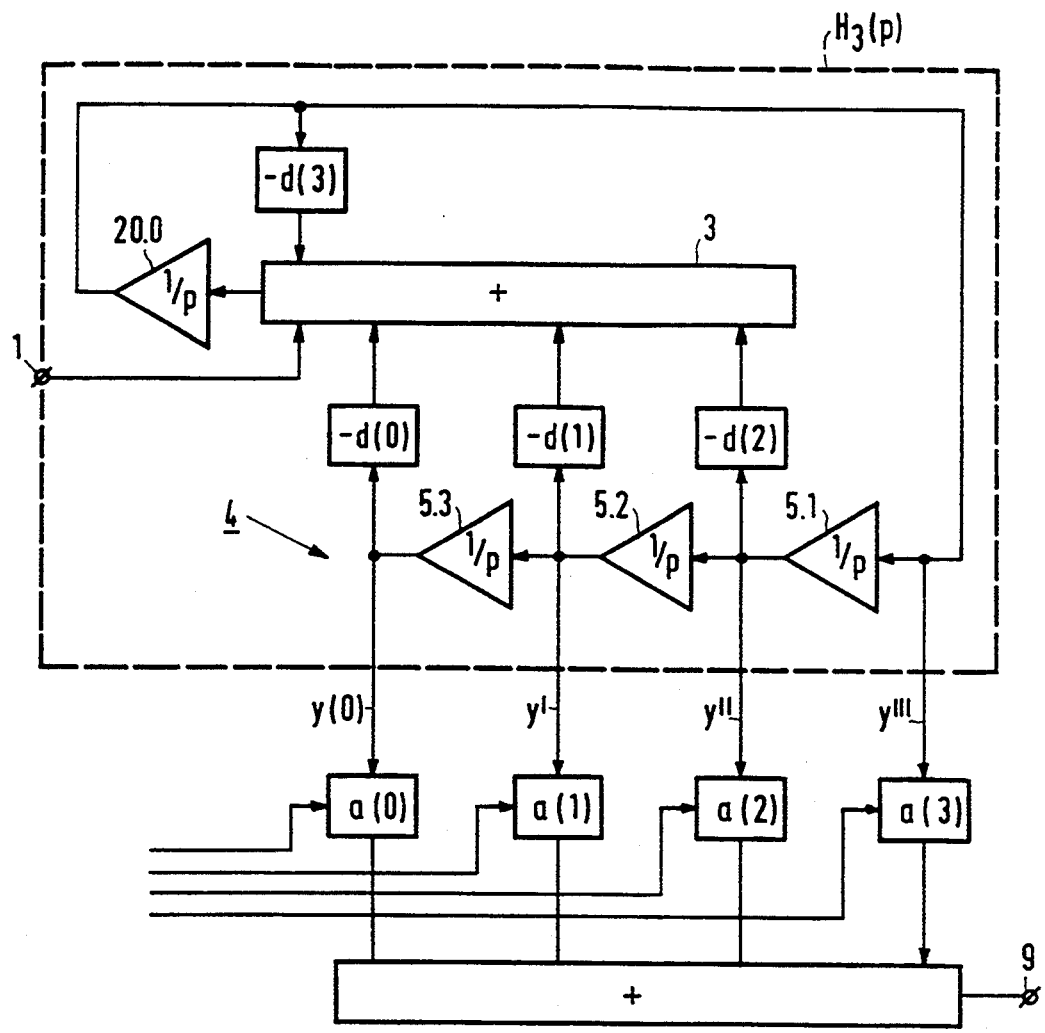
FIG. 11c shows the construction of a third circuit part of the filter of FIG. 10.

H₃(p) can be realized by means of the filter arrangement of FIG. 3, which leads to the filter arrangement of FIG. 11c. As the power of p in the denominator of H₃(P) is 4 at the most, this means that K+N+1=4. Further, the power of p in the numerator of H₃(p) is zero, so that K=0. Therefore, N=3, which leads to the circuit construction of FIG. 11c. Only three integrator elements 5.1, 5.2 and 5.3 in the series arrangement 4 are present. This means that the embodiment of FIG. 11c can generate y(0), as well as three derivatives of y(0), namely y', which is the first derivative of y(0), y'', which is the second derivative of y(0) and y''', which is the third derivative of y(0). Further, the series arrangement 20 comprises only one integrator element 20.0.

Figure 11D:
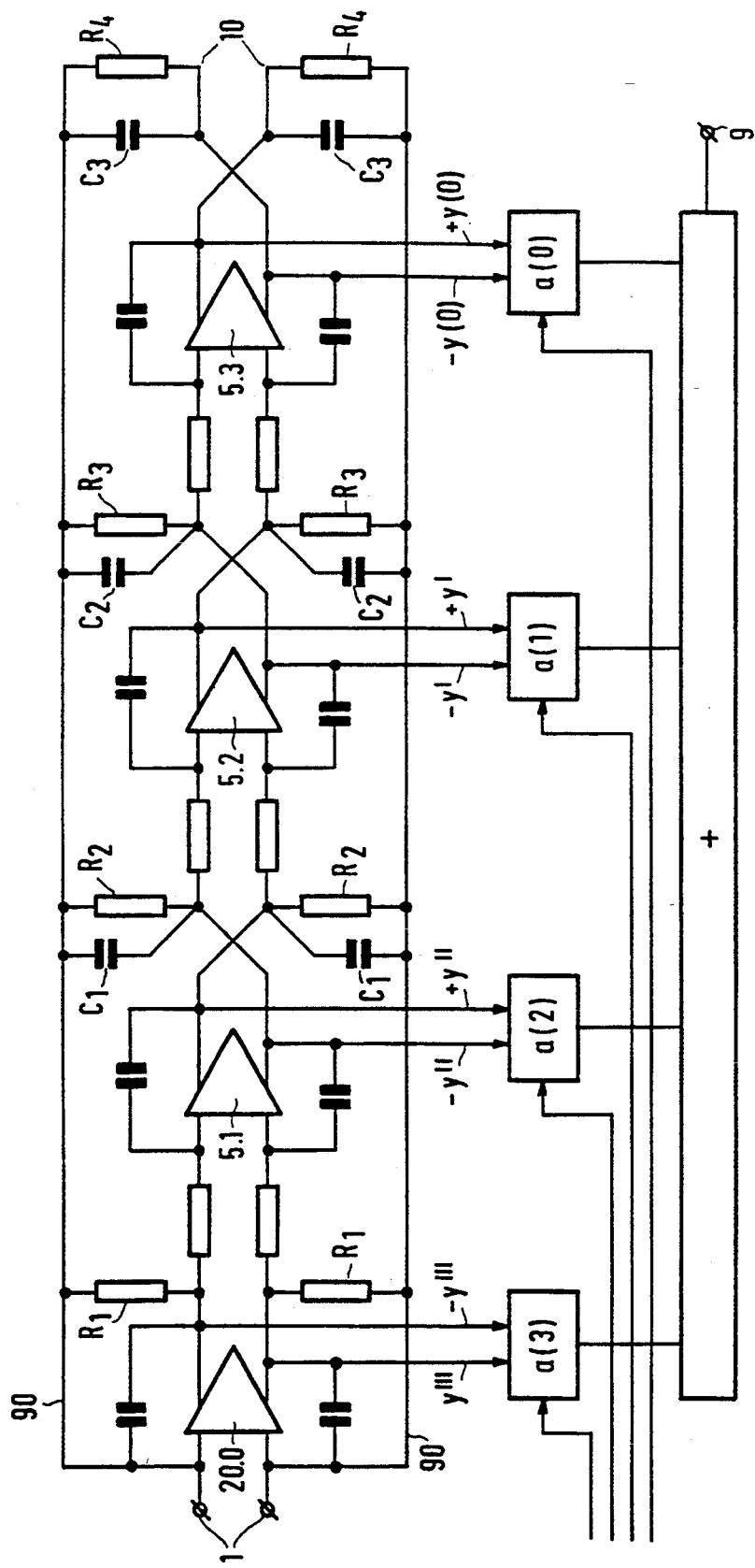
FIG. 11d shows a different construction of the third circuit part of FIG. 11c.

FIG. 11d shows a circuit construction of the filter of FIG. 11c using balanced integrators. The resistors R1 coupled between the outputs of the integrator element 20.0 and the negative feedback lines 90 and the capacitors C1 coupled between the outputs of the integrator element 5.1 and the feedback lines 90 act together to realize the multiplication factor d(3). The resistors R2 coupled between the outputs of the integrator element 5.1 and the negative feedback lines 90 and the capacitors C2 coupled between the outputs of the integrator element 5.2 and the feedback lines 90 act together to realize the multiplication factor d(2). The resistors R3 coupled between the outputs of the integrator element 5.2 and the negative feedback lines 90 and the capacitors C3 coupled between the outputs of the integrator element 5.3 and the feedback lines 90 act together to realize the multiplication factor d(1). The resistors R4 coupled between the outputs of the integrator element 5.3 and the negative feedback lines 90 realize the multiplication factor d(0). As can be seen, the coefficients d(1), d(2) and d(3) have been partly implemented by means of capacitors. But it could have been possible to realize all the coefficients in the form of resistors.

The realization of the filter arrangement in the form of the FIGS. 1 and 3 enables an integration of the filter arrangement in analog form which occupies only a small chip area.

A minimum number of integrator elements can be used to implement the filter arrangement, as the order of the filter equals the number of integrating elements in the filter.

Figure 12:
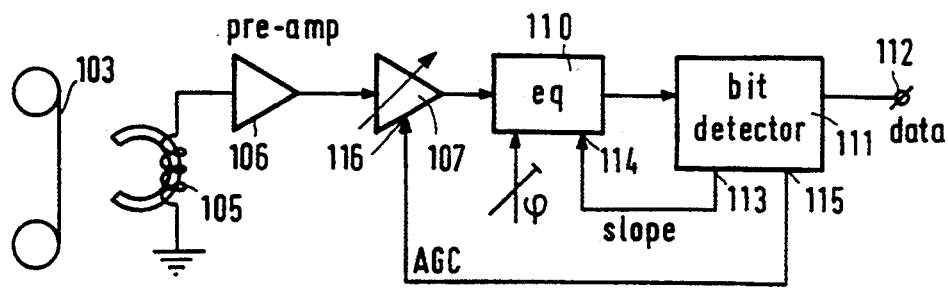
FIG. 12 shows the application of the filter arrangement as a variable equalizer in a magnetic reproduction arrangement.

FIG. 12 shows the application of the filter arrangement of FIG. 1, 3 or 10/11 in a reproducing arrangement for reproducing a signal from a magnetic record carrier 103. Reproduction is carried out by means of a reproducing head 105, so that the signal reproduced can be amplified in a pre amplifier 106, further amplified in an automatic gain amplifier 107, after which the signal is applied to an input of variable equalizer means 110. The reproducing arrangement further comprises equalizer control signal generator means included in a bit detector 111. At the output 112 of the bitdetector 111 the digital information signal is present. The equalizer control signal generator means have an output 113 coupled to a control signal input 114 of the variable equalizer means 110. A further output 115 is coupled to a control signal input 116 of AGC 107.

As an example, the frequency characteristic H(p) of the fixed filter in the variable equalizer means, which frequency characteristic equals $y(0)/V_{in}$, as has been explained previously, is such that it realizes a predistortion of PW50 (which has a relation with the inclination angle α used previously) which equals 0.2, and a fixed phase $\phi_0$ of 20° over the frequency range of interest. Further varying the phase has not been carried out, as varying the phase of the sampling moments in the bitdetector 111 has a similar effect as varying the phase in the variable equalizer. The control signal applied to the control input 114 controls the slope, and thus the angle α in FIG. 5a.

I claim:

1. Continuous-time analog signal filter arrangement, for realizing a magnitude frequency characteristic which increases for increasing frequencies over a part of the operating frequency range of the filter arrangement, comprising an input terminal for receiving an input signal, an output terminal for supplying an output signal which is a filtered version of the input signal, and number of integrator elements connected in series and being included in a feedback loop, where N is an integer number greater than or equal to 2, characterized in that, for each two successive integrator elements in the series arrangement of N integrator elements, the relation holds that the output signal of the first one of said two successive integrator elements is a differentiated version of the output signal of the next one of said two successive integrator elements, that the filter arrangement includes first multiplier means for multiplying the signals at the input of the first integrator element in the series arrangement of N integrator elements and at the outputs of the integrator elements by respective first multiplication factors and for supplying the multiplied signals to a first signal combination means, an output of the first signal combination means being coupled to the output terminal, that at least a number of the multiplication factors in the first multiplier means is variable, that the filter arrangement further includes second multiplier means for multiplying the signals at the input of the first integrator element in the series arrangement of N integrator elements and at the outputs of the integrator elements by respective second multiplication factors and for supplying the multiplied signals to a second signal combination means, an output of the second signal combination means being coupled to an input of the series arrangement via an additional integrator element.

2. Filter arrangement as claimed in claim 1, characterized in that the arrangement comprises a second series arrangement of K+1 integrator elements, the additional integrator element being the first integrator element in the second series arrangement of K+1 integrator elements, an output of the last integrator element in the second series arrangement being coupled to the input of the first integrator element in the first series arrangement, where K is an integer for which it holds that K is:equal to or larger than 0, and that for the last integrator element in the second series arrangement and the first integrator element in the first series arrangement the relation holds that the output signal of the last integrator element in the second series arrangement is a differentiated version of the output signal of the first integrator element in the first series arrangement.

3. Filter arrangement as claimed in claim 2, characterized in that, a third signal combination means is provided having a first input coupled to an output of an integrator element in the second series arrangement of K+1 integrator elements, a second input and an output which is coupled to an input of a subsequent integrator element in the second series arrangement.

4. Filter arrangement as claimed in claim 3, characterized in that, the output of the last integrator element in the second series arrangement is coupled to the second input of the third signal combination means via a third multiplier means.

5. Filter arrangement as claimed in claim 4, characterized in that, the input terminal is coupled to an input of the third signal combination means via a fourth multiplier means.

6. Filter arrangement as claimed in claim 5, characterized in that, at least a number of the multiplication factors in the first multiplier means are variable in response to a control signal supplied to the first multiplier means.

7. Filter arrangement as claimed in claim 4, characterized in that, at least a number of the multiplication factors in the first multiplier means are variable in response to a control signal supplied to the first multiplier means.

8. Filter arrangement as claimed in claim 3, characterized in that, the input terminal is coupled to an input of the third signal combination means via a fourth multiplier means.

9. Filter arrangement as claimed in claim 8, characterized in that, at least a number of the multiplication factors in the first multiplier means are variable in response to a control signal supplied to the first multiplier means.

10. Filter arrangement as claimed in claim 3, characterized in that, at least a number of the multiplication factors in the first multiplier means are variable in response to a control signal supplied to the first multiplier means.

11. Filter arrangement as claimed in claim 2, characterized in that, at least a number of the multiplication factors in the first multiplier means are variable in response to a control signal supplied to the first multiplier means.

12. Filter arrangement as claimed in claim 1, characterized in that, the input terminal is coupled to an input of the second signal combination means via a fifth multiplier means.

13. Filter arrangement as claimed in claim 12, characterized in that, at least a number of the multiplication factors in the first multiplier means are variable in response to a control signal supplied to the first multiplier means.

14. Filter arrangement as claimed in claim 1, characterized in that, for the additional integrator element and the first integrator element in the first series arrangement the relation holds that the output signal of the additional integrator element is a differentiated version of the output signal of the first integrator element in the first series arrangement.

15. Reproducing arrangement for reproducing an information signal from a track in a magnetic record carrier, comprising variable equalizer means for equalizing the signal read from the track, characterized in that the variable equalizer means take the form of a filter arrangement as claimed in claim 14.

16. Filter arrangement as claimed in claim 1, characterized in that, at least a number of the multiplication factors in the first multiplier means are variable in response to a control signal supplied to the first multiplier means.

17. Reproducing arrangement for reproducing an information signal from a track in a magnetic record carrier, comprising variable equalizer means for equalizing the signal read from the track, characterized in that the variable equalizer means take the form of a filter arrangement as claimed in claim 1.

* * * * *